(12) United States Patent
Bell et al.

(10) Patent No.: US 6,362,517 B1
(45) Date of Patent: Mar. 26, 2002

(54) HIGH VOLTAGE PACKAGE FOR ELECTRONIC DEVICE

(76) Inventors: Michael Ray Bell, 4606 Cedar Springs Rd., Apt. 2035, Dallas, TX (US) 75219; Raymond G. Mayer, 4440 Cranwood Dr., Plano, TX (US) 75024; Vito Savino, 2101 Blackfoot Trail, Mesquite, TX (US) 75149

( * ) Notice: Subject to any disclaimer, the term of this patent is extended or adjusted under 35 U.S.C. 154(b) by 0 days.

(21) Appl. No.: 09/404,135

(22) Filed: Sep. 22, 1999

(51) Int. Cl.[7] ............................................. H01L 23/495
(52) U.S. Cl. ................... 257/678; 257/666; 257/706; 257/730; 257/731; 257/687; 257/678
(58) Field of Search ................................ 257/706, 678, 257/666, 730, 731, 692, 693, 696, 698, 687

(56) References Cited

U.S. PATENT DOCUMENTS

| | | | | |
|---|---|---|---|---|
| 4,420,078 A | * | 12/1983 | Belt et al. .................. 206/305 |
| 5,454,320 A | * | 10/1995 | Hilden et al. ............. 102/202.7 |
| 5,460,545 A | * | 10/1995 | Siemon et al. .............. 439/308 |
| 5,837,887 A | * | 11/1998 | Shibata et al. ............. 73/35.11 |
| 5,911,588 A | * | 6/1999 | Kern .......................... 439/278 |
| 5,917,236 A | * | 6/1999 | Leader, III et al. ......... 257/678 |
| 6,008,530 A | * | 12/1999 | Kano ......................... 257/696 |

* cited by examiner

Primary Examiner—Alexander O. Williams
(74) Attorney, Agent, or Firm—Law Office of Donald D. Mondul

(57) ABSTRACT

An improved package for a semiconductor device. The semiconductor device includes an apparatus having at least two access leads to facilitate electrical connection of the apparatus within an electrical circuit. The package has generally a closed polyhedral shape presenting a plurality of faces and substantially insulatingly surrounding the apparatus in a manner leaving the access leads exposed for effecting electrical connection. The access leads extend a distance from exit loci from the package. The exit loci are situated on an exit face of the package, adjacent pairs of exit loci being generally in a common plane. An intraplanar distance within the common plane is established intermediate each adjacent pair of the exit loci. The improvement comprises configuring the exit face to establish an on-surface path greater than the intraplanar distance intermediate selected adjacent pairs of the exit loci.

8 Claims, 5 Drawing Sheets

HIGH VOLTAGE PACKAGE FOR ELECTRONIC DEVICE

BACKGROUND OF THE INVENTION

The present invention is directed to packaging for electronic devices, and is particularly directed to an improved package for semiconductor devices. Some commonly available semiconductor devices, such as the TO-220 are ill suited for high voltage circuit applications, such as a switching transistor in the primary side of a switch-mode power supply. A principal shortcoming is in the lead-to-lead spacing. In the TO-220 device, the lead spacing is not sufficiently great to allow adequate creepage on the package of the device itself. Creepage is defined as the shortest distance between two conductive parts as it is measured along an insulated surface. Thus, creepage in a device having two leads extending from an insulating package is the shortest distance between the two leads, as measured along the face of the package. Failures due to insufficient creepage may be caused by the presence of environmental contaminants, such as dust. Such conditions may lead to a short circuit between leads. Such high impedance shorts may cause catastrophic failure of the device and, indeed, may cause failure of the entire circuit in which the device is employed. Generally, shorting is a function of several factors: the working voltage employed in the circuit, the dielectric constant of the insulating medium, and the presence or absence of environmental contaminants.

Insufficient creepage and the potential for high impedance shorts are known. Previously, the solution to the problem has simply been to incorporate a physically larger part in the circuit design for higher voltage or essential circuits. Such larger parts have wider lead-to-lead spacing and, therefore, greater creepage. In today's market the pressure is for ever smaller, more compact products. In view of this pressure to produce smaller products requiring smaller component circuitry, the previous expedient solution of simply specifying and employing a larger part to obviate creepage problems is no longer a good solution.

Another attempt to solve the creepage problem has been to encase the leads of devices in silicone materials. However, this is not a reliable solution because of the difficulty of handling silicone during manufacturing and assembly operations. Adequate coverage of the leads cannot be guaranteed as silicone has a tendency to migrate. This use of silicone can be deleterious, as silicone tends to contaminate other operations in a manufacturing plant. For example, the printing of labels on components for a product may be seriously negatively impacted by silicone contamination. Further, once silicone contamination has occurred across processes in a manufacturing plant, it is difficult to eliminate.

There is a need for a package which will establish acceptable creepage for high-voltage applications without requiring larger components occupying excessive board area in circuit implementations.

SUMMARY OF THE INVENTION

The preferred embodiment of the present invention is an improved package for an electronic device, and especially for a semiconductor device. The semiconductor device includes an apparatus having at least two access leads to facilitate electrical connection of the apparatus within an electrical circuit. The package has generally a closed polyhedral shape presenting a plurality of faces and substantially insulatingly surrounding the apparatus in a manner leaving the at least two access leads uninsulatedly exposed for effecting electrical connection with the apparatus. The at least two access leads extend a distance from at least two exit loci from the package. The at least two exit loci are situated on an exit face of the package and lie generally in a common plane. An intraplanar distance within a common plane is established intermediate each adjacent pair of the at least two exit loci. The improvement comprises configuring the exit face to establish an on-surface path greater than the intraplanar distance intermediate selected adjacent pairs of the exit loci.

The invention provides an improved high-voltage power semiconductor package. By including structure on the face of the package intermediate selected electrical leads of the semiconductor device to increase the on-surface distance between the selected leads, creepage is increased. Increasing creepage increases the potential necessary to short the selected leads. The result is a higher voltage capacity for the semiconductor device without having to use a larger, bulkier device to achieve greater creepage.

The preferred embodiment of the present invention involves providing walls intermediate leads. The provision of walls intermediate leads is an especially attractive embodiment since it would not require adding material to an existing package mold for a part to effect the change. To add the desired walls between leads, one would merely need to appropriately remove some material from the package mold. The removed area would then fill with packaging material during molding, and the result would be manifested in the form of the desired walls.

Alternate embodiments of the present invention may be configured using depressions, or trenches, or grooves intermediate leads. Such alternate embodiments require that material be added to an existing package mold to construct the desired depressions in a finished molded package. Thus, this alternate construction would require the construction of a wholly new mold.

Other alternate embodiments of the present invention may be configured by forming insulating wraps on selected leads during the molding of the package by over-molding package material on the selected leads. The overmolding may be effected on the two outboard leads adjacent the center lead on a three-lead semiconductor device, such as a power transistor. Another construction would have the overmolding being effected only on the center lead of a three-lead device.

It is, therefore, an object of the present invention to provide an improved package for an electronic device which increases creepage in the finished packaged device.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
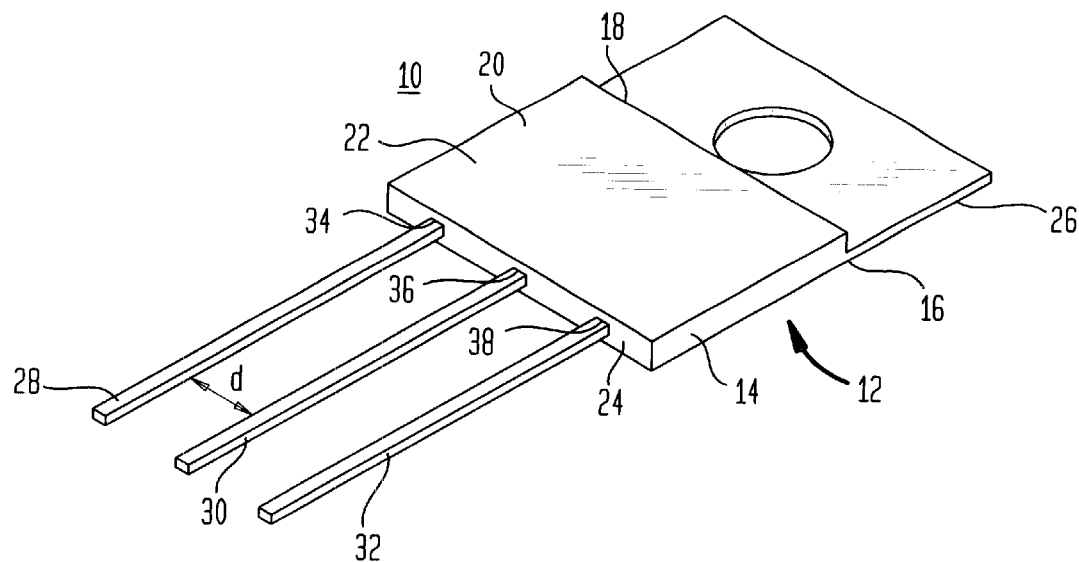
FIG. 1 is a perspective drawing illustrating one embodiment of a prior art semiconductor device.

FIG. 1 is a perspective drawing illustrating one embodiment of a prior art semiconductor device. In FIG. 1, a prior art semiconductor device 10 has an insulating package 12, generally in the shape of a closed polyhedron having a plurality of faces 14, 16, 18, 20, 22, 24. Package 12 substantially encloses, or surrounds, an interior electronic apparatus (not shown in FIG. 1), except a tab 26, which may or may not be insulated, and electrical leads 28, 30, 32, which are not insulated. Free access to electrical leads 28, 30, 32 and, when not insulated, to tab 26, facilitates connecting semiconductor device 10 in electronic circuitry (not shown in FIG. 1) for employment in a product. Electrical leads 28, 30, 32 exit package 12 from a common exit face 24 at exit loci 34, 36, 38. The distance between selected adjacent electrical leads, for example electrical leads 28, 30 in FIG. 1, is important. Such separation contributes to the prevention of high impedance shorts of semiconductor device 10 between the selected electrical leads 28, 30 which may operate at a high potential difference relative to one another. The displacement "d" between selected electrical leads 28, 30, when measured through the air separating electrical leads 28, 30, is called the clearance between leads 28, 30. When the separation between selected leads 28, 30 is measured along the surface of exit face 24 intermediate exit loci 34, 36 (that is, between the closest proximate conductive points on adjacent leads 28, 30), the displacement is called creepage.

Figure 2:
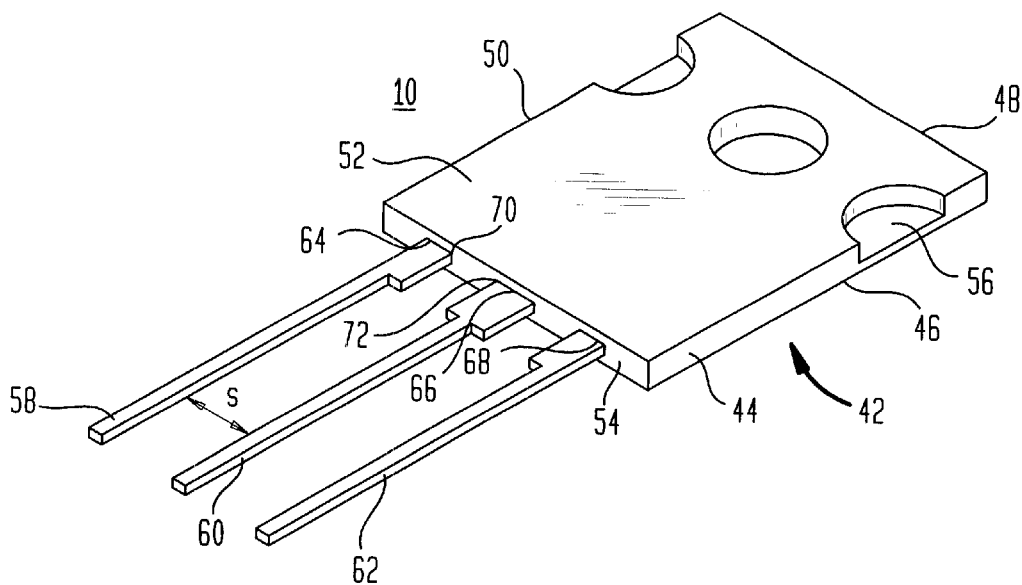
FIG. 2 is a perspective drawing illustrating a second embodiment of a prior art semiconductor device.

FIG. 2 is a perspective drawing illustrating a second embodiment of a prior art semiconductor device. In FIG. 2, a prior art semiconductor device 40 has an insulating package 42, generally in the shape of a closed polyhedron having a plurality of faces 44, 46, 48, 50, 52, 54. Package 42 substantially encloses, or surrounds, an interior electronic apparatus (not shown in FIG. 2), except a tab 56, which may or may not be insulated, and electrical leads 58, 60, 62, which are not insulated. Tab 56 is substantially, though not entirely, enclosed at faces 44, 48, 50, 52, 54 of package 42; not shown in detail in FIG. 2 is the construction that allows substantially free access to tab 56 at lower face 46 of package 42. That is, tab 56 substantially overlays lower face 46 of package 42 and is configured to rest in abutting relationship with a printed wiring board or heat sink (not shown in FIG. 2) when semiconductor device 40 is installed in an electrical circuit. Electrical access to tab 56 and other electrical leads 58, 60, 62 facilitates connecting semiconductor 40 in electronic circuitry (not shown in FIG. 2) for employment in a product. Electrical leads 58, 60, 62 exit package 42 from a common exit face 54 at exit loci 64, 66, 68. The separation distance between selected adjacent electrical leads, for example displacement "s" between electrical leads 58, 60 in FIG. 2, when measured through the air separating electrical leads 58, 60, is the clearance between leads 58, 60. When the separation between selected leads 58, 60 is measured along the surface of exit face 54 intermediate the most proximate conductive points 70, 72 of exit loci 64, 66, the distance is called creepage.

Figure 3:
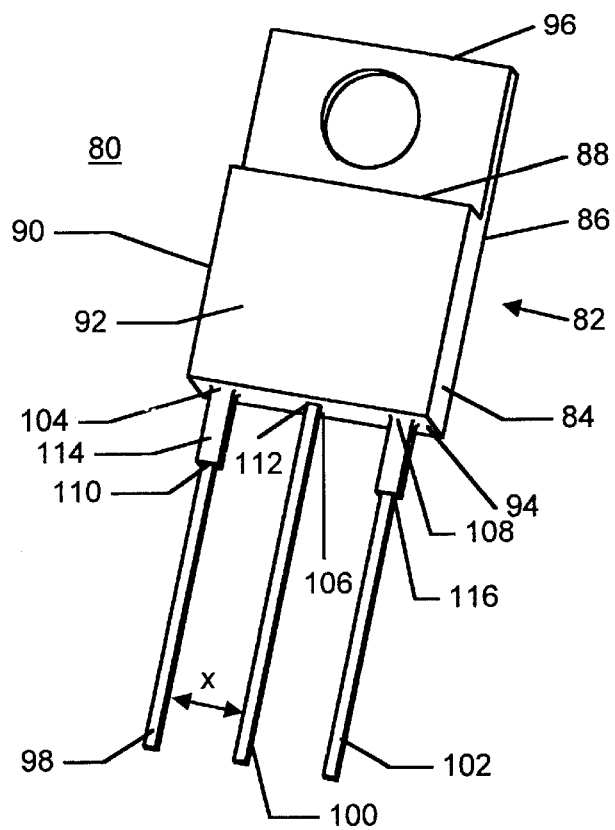
FIG. 3 is a perspective drawing illustrating a first embodiment of the present invention.

FIG. 3 is a perspective drawing illustrating a first embodiment of the present invention. In FIG. 3, a semiconductor device 80 has an insulating package 82, generally in the shape of a closed polyhedron having a plurality of faces 84, 86, 88, 90, 92, 94. Package 82 substantially encloses, or surrounds, an interior electronic apparatus (not shown in FIG. 3), except a tab 96, which may or may not be insulated, and electrical leads 98, 100, 102, which are not insulated. Electrical access to tab 96 and other electrical leads 98, 100, 102 facilitates connecting semiconductor 80 in electronic circuitry (not shown in FIG. 3) for employment in a product. Electrical leads 98, 100, 102 exit package 82 from a common exit face 94 at exit loci 104, 106, 108.

Electrical leads 98, 102 each have overmolded thereupon an insulating wrap, or shroud, 114, 116. Preferably insulating wraps 114, 116 are integrally formed with package 82. Thus, with insulating wraps 114, 116 incorporated into exit face 94, there is established an effective exit locus 115 where lead 98 exits package 82, and there is established an effective exit locus 121 where lead 102 exits package 82. In the embodiment of the invention illustrated in FIG. 3, the clearance between leads 98, 100 is measured within a plane containing effective exit locus 115 and point 112. Those two points 115, 112 are the closest proximate conductive points on adjacent leads 98, 100. The creepage between leads 98, 100 in the embodiment illustrated in FIG. 3 is measured along the surface of insulating wrap 114 from point 115, to point 113, and thence to point 112. Similarly, the clearance between leads 100, 102 is measured in a plane containing effective exit locus 121 and point 117. Those two points 121, 117 are the closest proximate conductive points on adjacent leads 100, 102. The creepage between leads 100, 102 in the embodiment illustrated in FIG. 3 is measured along the surface of insulating wrap 116 from point 121, to point 119, and thence to point 117. Thus, insulating wrap 114 increases creepage between electrical leads 98, 100 and insulating wrap 116 increases creepage between electrical leads 100, 102.

Figure 4:
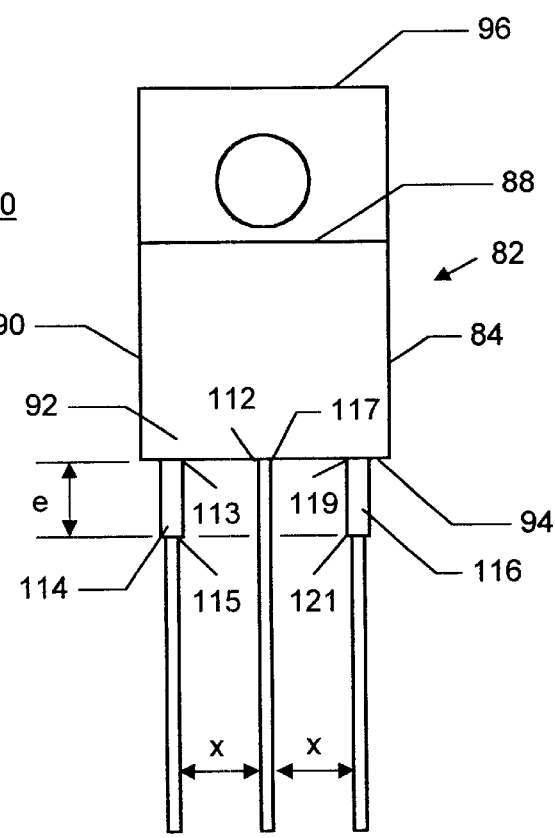
FIG. 4 is a front plan view of the first embodiment of the present invention illustrated in FIG. 3.

FIG. 4 is a front plan view of the first embodiment of the present invention illustrated in FIG. 3. Elements appearing in both FIGS. 3 and 4 are identified with like reference numerals to aid in understanding the invention. In FIG. 4, the separation distance, "x", between adjacent electrical leads 98, 100 when measured through the air separating electrical leads 98, 100, is the clearance between leads 98, 100. The distance "x" is substantially the same as the distance between points 112, 113, which is substantially what the creepage between leads 98, 100 would be without insulating wrap 114. Similarly, the separation distance, "x", between adjacent electrical leads 100, 102 measured through the air separating electrical leads 100, 102, is the clearance between leads 100, 102, and is substantially the same as the distance between points 117, 119. The distance between points 117, 119 is substantially what the creepage between leads 100, 102 would be without insulating wrap 116. It is not required that the clearance between leads 98, 100 must be equal to the clearance between leads 100, 102. Such equal clearances are illustrated here merely for convenience and to simplify the description of the invention.

As mentioned earlier, the measurement of the separation of adjacent leads along the surface of exit face 94 intermediate the most proximate conductive points of the adjacent leads is the creepage between the selected leads. Thus, creepage between leads 98, 100 is the distance from point 115, to point 113, to point 112. If insulating wraps 114, 116 extend a distance "e" from exit face 94 of package 82, inspection of FIG. 4 reveals that distance "e" is substantially equal to the distance from point 115 to point 113, and substantially equal to the distance from point 121 to point 119. For purposes of simplifying the explanation of the invention, assume, for example, that the width of insulating wrap 114 is relatively small compared with the distance "e+x". Then creepage between leads 98, 100 is substantially equal to "e+x". In the embodiment of the present invention illustrated in FIGS. 3 and 4, distance "x" is substantially what the creepage between leads 98, 100 and between leads 100, 102 would be without insulating wraps 114, 116. That is, the distance "x" in FIGS. 3 and 4 would be the creepage of semiconductor device 80 between the pairs of leads 98, 100 and 100, 102 if semiconductor 80 were configured according to the prior art construction illustrated in FIG. 1. Thus, by the structure employed in the embodiment of the present invention illustrated in FIGS. 3 and 4, creepage between pairs of leads 98, 100 and 100, 102 is increased from "x" to "x+e".

Figure 5:
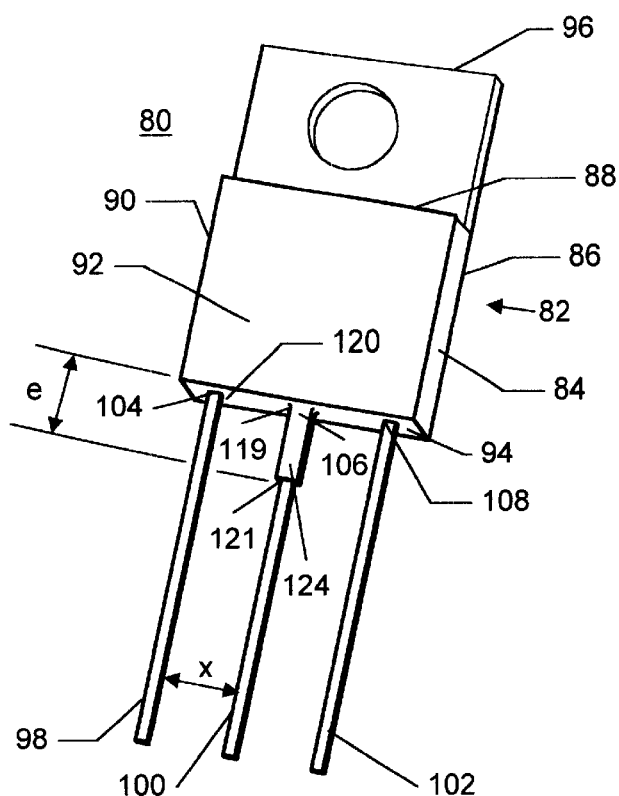
FIG. 5 is a perspective drawing illustrating a second embodiment of the present invention.

FIG. 5 is a perspective drawing illustrating a second embodiment of the present invention. For purposes of facilitating understanding alternate embodiments of the present invention illustrated in FIGS. 5–7, and in order to avoid unnecessary prolixity, like elements will be identified using like reference numerals in the various FIGS. 4–7, and descriptions of similar structural features will not be repeated. In FIG. 5, a semiconductor device 80 has a package 82 with electrical leads 98, 100, 102 extending from an exit face 94. Lead 100 only has an insulating wrap 124, preferably integrally formed with package 82. Insulating wrap 124 extends a distance "e" from exit face 94, between points 119, 121. Creepage between leads 98, 100 is measured between the closest proximate conductive points 120, 121 on leads 98, 100. Leads 98, 100 have a clearance of "x". Discounting the thickness of insulating wrap 124 as significantly less than the distance "e+x", the embodiment of the present invention illustrated in FIG. 5 has creepage between leads 98, 100 substantially equal to the distance "e+x".

Figure 6:
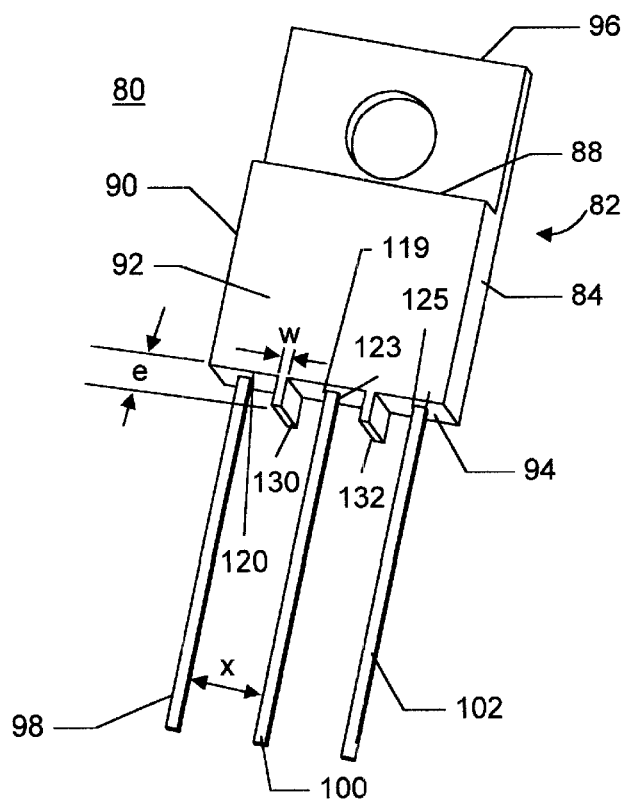
FIG. 6 is a perspective drawing illustrating the preferred embodiment of the present invention.

FIG. 6 is a perspective drawing illustrating the preferred embodiment of the present invention. In FIG. 6, a semiconductor device 80 has a package 82 with electrical leads 98, 100, 102 extending from an exit face 94. An insulating elevation, or wall 130 is established intermediate leads 98, 100, and an insulating elevation, or wall 132 is established intermediate leads 100, 102. Insulating walls 130, 132 are preferably integrally formed with package 82 and each wall 130, 132 extends substantially from rear face 86 to front face 92 of package 82. Insulating walls 130, 132 extend a distance "e" from exit face 94, and each insulating wall 130, 132 has a width "w". It is not necessary that insulating walls 130, 132 have equal width "w" or equal height "e", only convenient to facilitate simple illustration. Thus, in the embodiment of the present invention illustrated in FIG. 6, creepage between leads 98, 100 is measured between the closest proximate conductive points 120, 119 on leads 98, 100. Leads 98, 100 have a clearance of "x". Creepage, measured on the surfaces between proximate conductive points 119, 120, is equal to "x" plus twice the height "e" of wall 130. The width "w" of wall 130 is merely equal to the expanse of exit face 94 which would be traversed by the described path if wall 130 were not present. Thus creepage between leads 98, 100, in the embodiment of the present invention illustrated in FIG. 6, is equal to the distance "x+b 2e".

Figure 7:
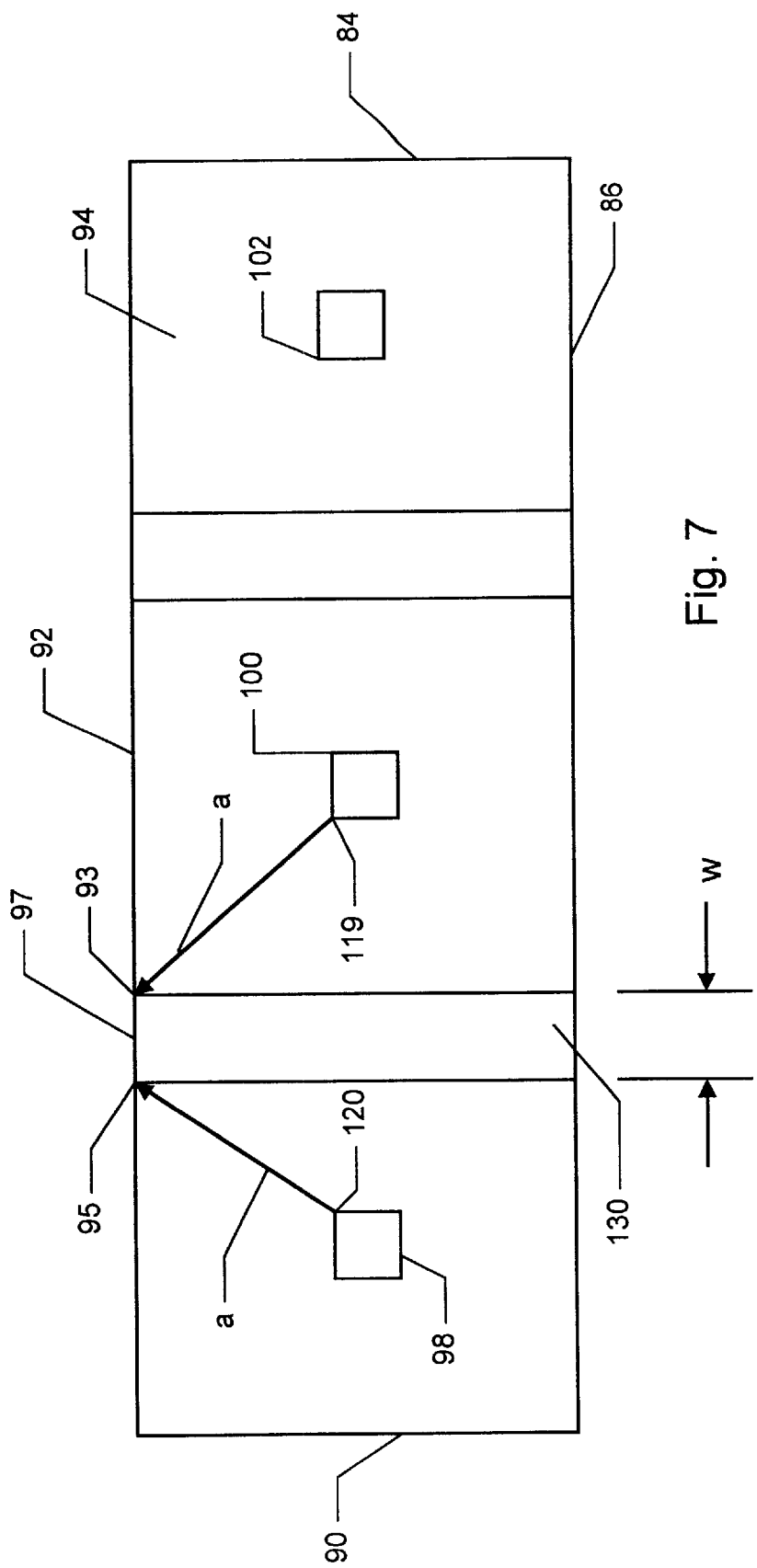
FIG. 7 is an elevation view of face 94 of the preferred embodiment of the present invention.

FIG. 7 is an elevation view of face 94 of the preferred embodiment of the present invention. Alternate creepage paths exist in "end around" traversals of walls 130, 132. Thus, by way of example in FIG. 7, an alternate creepage path exists between conductive points 119, 120 that departs from conductive point 119, progresses to the intersection 93 of wall 130 with face 92, proceeds along the integral juncture line 97 of face 92 and wall 130 to the intersection 95 of wall 130 with face 92, and continues onward from intersection 95 to conductive point 120. If the distance from conductive point 119 to juncture 93 is a distance "a", and if wall 130 is equidistant from conductive points 119, 120, then the distance from conductive point 120 to the juncture 95 is also a distance "a". Integral juncture line 97 is equal to the width "w" of wall 130. Thus, the exemplary alternate creepage path illustrated in FIG. 7 has a length equal to the distance "2a+w". Wall 130 need not be equidistant from conductive points 119, 120; it is illustrated in that configuration in FIG. 7 solely to simplify explanation of the invention. Thus, a creepage path over wall 130 will be greater than a creepage path around wall 130, only when (x+2e)>(2a+w). This relationship is useful to determine what height a wall, such as wall 130, must be in order to provide an advantage of longer creepage path than would be established in an "end around" creepage path, such as the exemplary creepage path illustrated in FIG. 7.

Figure 8:
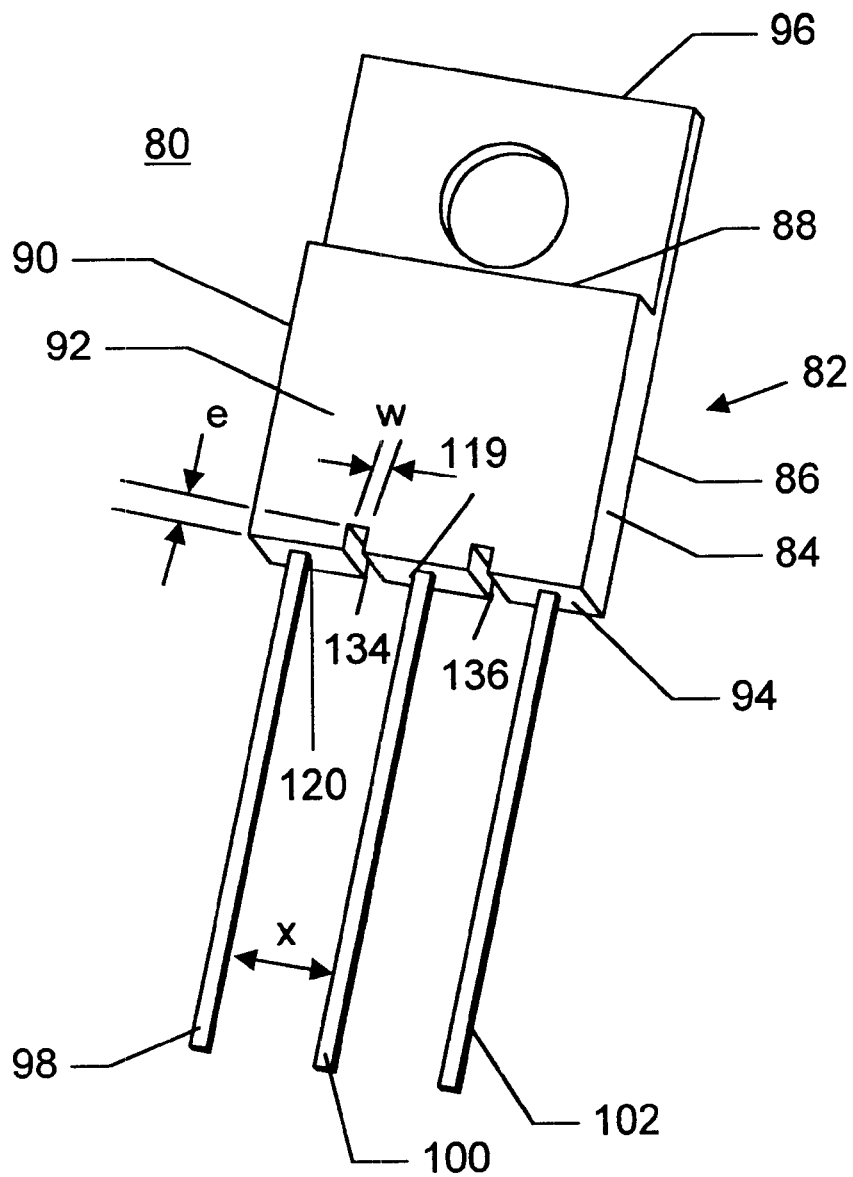
FIG. 8 is a perspective drawing illustrating another embodiment of the present invention.

FIG. 8 is a perspective drawing illustrating another embodiment of the present invention. In FIG. 8, a semiconductor device 80 has a package 82 with electrical leads 98, 100, 102 extending from an exit face 94. A depression 134 is established intermediate leads 98, 100; a depression 136 is established intermediate leads 100, 102. Depressions 134, 136 are preferably in the form of grooves, or trenches, extending substantially completely from rear face 86 to front face 92 of package 82. Each depression 134, 136 extends a depth "e" from exit face 94 and has a width "w". It is not necessary that depressions 134, 136 have equal depth "e" or equal width "w"; it is only convenient here to facilitate simple illustration. Thus, in the embodiment of the present invention illustrated in FIG. 8, creepage between leads 98, 100 is measured between the closest proximate conductive points 120, 119 on leads 98, 100. Leads 98, 100 have a clearance of "x". Creepage, measured on the surfaces of package 82 between proximate conductive points 119, 120, is equal to "x" plus twice the depth "e" of depression 134, plus the width "w" of depression 134. Thus creepage between leads 98, 100 in the embodiment of the present invention illustrated in FIG. 8 is equal to the distance "x+2e".

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. An improved package for an electronic device; said electronic device including an apparatus having at least two access leads to facilitate electrical connection of said apparatus within an electrical circuit; the package having generally a closed polyhedral shape presenting a plurality of faces and substantially insulatingly surrounding said apparatus in a manner leaving said at least two access leads uninsulatedly exposed for effecting said electrical connection; said at least two access leads extending a distance from at least two exit loci from the package; said at least two exit loci being situated on an exit face of said plurality of faces; adjacent pairs exit loci of said at least two exit loci being generally in a common plane, a shortest intraplanar distance within said common plane being established intermediate each said adjacent pair of exit loci; the improvement comprising configuring said exit face to establish an on-surface path greater than said intraplanar distance intermediate selected said adjacent pairs of exit loci.

2. An improved package for an electronic device as recited in claim 1 wherein said exit face includes at least one depression intermediate said selected adjacent pairs of exit loci.

3. An improved package for an electronic device as recited in claim 1 wherein said exit face includes at least one elevation intermediate said selected adjacent pairs of exit loci.

4. An improved package for an electronic device as recited in claim 1 wherein said exit face extends from the package to insulatingly surround a portion of at least one of said at least two access leads at at least one exit locus of at least one of said selected adjacent pairs of exit loci.

5. An improved package for an electronic device; said electronic device including an apparatus having a plurality of access leads to facilitate electrical connection of said apparatus within an electrical circuit; the package having generally a closed polyhedral shape presenting a plurality of generally rectangular faces and substantially insulatingly surrounding said apparatus in a manner leaving said plurality of access leads electrically accessible for effecting said connection; selected leads of said plurality of leads each extending a distance from the package from respective exit loci on an exit face of said plurality of faces; adjacent pairs of exit loci of said respective exit loci being situated generally in a common plane, an intraplanar distance within said common plane being established intermediate each said adjacent pair of exit loci; the improvement comprising configuring said exit face to establish an onsurface path greater than said intraplanar distance intermediate selected said adjacent pairs of exit loci.

6. An improved package for an electronic device as recited in claim 5 wherein said exit face includes at least one depression intermediate said selected adjacent pairs of exit loci.

7. An improved package for an electronic device as recited in claim 5 wherein said exit face includes at least one elevation intermediate said selected adjacent pairs of exit loci.

8. An improved package for an electronic device as recited in claim 5 wherein said exit face extends from the package to insulatingly surround a portion of at least one of said selected leads at at least one exit locus of at least one of said selected adjacent pairs of exit loci.

\* \* \* \* \*